(12) United States Patent
Kim et al.

(10) Patent No.: US 10,236,075 B1
(45) Date of Patent: Mar. 19, 2019

(54) PREDICTING TUNNEL BARRIER ENDURANCE USING REDUNDANT MEMORY STRUCTURES

(71) Applicant: Spin Transfer Technologies, Inc., Fremont, CA (US)

(72) Inventors: Kuk-Hwan Kim, San Jose, CA (US); Peter Cuevas, Los Gatos, CA (US); Benjamin Louie, Fremont, CA (US); Amitay Levi, Cupertino, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/851,593

(22) Filed: Dec. 21, 2017

(51) Int. Cl.
| | | |
|---|---|---|
| *G11C 11/00* | (2006.01) | |
| *G11C 29/08* | (2006.01) | |
| *G11C 11/16* | (2006.01) | |
| *G11C 29/00* | (2006.01) | |
| *H01L 43/08* | (2006.01) | |
| *H01L 27/22* | (2006.01) | |

(52) U.S. Cl.
CPC ............ *G11C 29/08* (2013.01); *G11C 11/161* (2013.01); *G11C 29/70* (2013.01); *H01L 27/228* (2013.01); *H01L 43/08* (2013.01)

(58) Field of Classification Search
CPC ....... G11C 29/08; G11C 11/161; G11C 29/70; G11C 27/228
USPC .................................................. 365/158, 171
See application file for complete search history.

(56) References Cited

U.S. PATENT DOCUMENTS

2009/0086531 A1* 4/2009 Yang ........................ G11C 11/16
365/158

* cited by examiner

*Primary Examiner* — Vu A Le
(74) *Attorney, Agent, or Firm* — Zilka-Kotab, P.C.

(57) ABSTRACT

A processor-implemented method, according to one embodiment, includes: activating a subset of a plurality of p-MTJ cells oriented in one or more columns of a MRAM array. Activating the subset of p-MTJ cells includes: applying a first voltage to a gate terminal of the transistor in each of the p-MTJ cells in parallel, applying a second voltage to a first end of the MTJ sensor in each of the p-MTJ cells in parallel, and applying a third voltage to a drain terminal of the transistor in each of the p-MTJ cells in parallel. The processor-implemented method also includes: monitoring the activated subset of p-MTJ cells, determining whether any of the activated p-MTJ cells have failed, and in response to determining that an activated p-MTJ cell has failed, physically locating the failed p-MTJ cell. Other systems, methods, and computer program products are described in additional embodiments.

20 Claims, 8 Drawing Sheets

PREDICTING TUNNEL BARRIER ENDURANCE USING REDUNDANT MEMORY STRUCTURES

FIELD OF THE INVENTION

The present invention relates to magnetoresistive random-access memory (MRAM), and more particularly, this invention relates to predicting the endurance of tunnel barrier layers used in memory cells of MRAM.

BACKGROUND

MRAM is a non-volatile memory technology that stores data through magnetic storage elements. Because MRAM is non-volatile, memory written thereto may be retained even when a power supply of the MRAM is turned off. The magnetic storage elements used to actually store the data include two ferromagnetic plates, or electrodes, that can hold a magnetic field and are separated by a non-magnetic material, such as a non-magnetic metal or insulator. In general, one of the plates is referred to as the reference layer and has a magnetization which is pinned. In other words, the reference layer has a higher coercivity than the other plate and requires a larger magnetic field or spin-polarized current to change the orientation of its magnetization. The second plate is typically referred to as the free layer and has a magnetization direction which can be changed by relatively smaller magnetic fields or a spin-polarized current relative to the reference layer.

MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

An important and continuing goal in the data storage industry is that of increasing the density of data stored on a medium. For storage devices which implement MRAM, that goal has led to decreasing the footprint of individual MRAM cells in an attempt to further increase the storage capacity per unit area. However, when forming increasingly smaller memory elements, process variability and fabrication imperfections may cause the characteristics of the resulting structure to have an effective resistance, thickness, surface roughness, etch profile, etc. that is different than intended. It follows that quality control for these memory element structures has an effect on the performance of the formed structure.

Furthermore, variations resulting during fabrication may have a relatively localized effect in some instances, while in others the variations may affect the resulting structure on more of a global scale depending on the cause of the variation which occurred. One such causes of variation includes point defects and/or clusters during layer deposition which will affect local thicknesses of the deposited layer around the point defects. Another cause of variation includes variation in the deposition condition of the chamber, e.g., including gas flow rates, pressure control, deposition temperature, RF plasma, etc.

SUMMARY

A processor-implemented method for testing memory cell endurance, according to one embodiment, includes: activating a subset of a plurality of perpendicular magnetic tunnel junction (p-MTJ) cells oriented in one or more columns of a MRAM array. Each of the p-MTJ cells includes a transistor and a magnetic tunnel junction (MTJ) sensor. Moreover, activating the subset of p-MTJ cells includes: applying a first voltage to a gate terminal of the transistor in each of the p-MTJ cells in the subset in parallel, applying a second voltage to a first end of the MTJ sensor in each of the p-MTJ cells in the subset in parallel, and applying a third voltage to a drain terminal of the transistor in each of the p-MTJ cells in the subset in parallel. A second end of the MTJ sensor in each of the p-MTJ cells is coupled to a source terminal of the transistor in the same p-MTJ cell. The processor-implemented method also includes: monitoring the activated subset of p-MTJ cells, determining whether any of the activated p-MTJ cells have failed, and in response to determining that an activated p-MTJ cell has failed, physically locating the failed p-MTJ cell.

A computer program product, according to another embodiment, includes a non-transitory computer readable storage medium, the computer readable storage medium having program code stored thereon. Moreover, the program code is executable by a processor to cause the processor to perform a process which includes: activate, by the processor, a subset of a plurality of p-MTJ cells oriented in one or more columns of a MRAM array. Each of the p-MTJ cells includes a transistor and a MTJ sensor. Furthermore, activating the subset of p-MTJ cells includes: apply, by the processor, a first voltage to a gate terminal of the transistor in each of the p-MTJ cells in the subset in parallel; apply, by the processor, a second voltage to a first end of the MTJ sensor in each of the p-MTJ cells in the subset in parallel; and apply, by the processor, a third voltage to a drain terminal of the transistor in each of the p-MTJ cells in the subset in parallel. It should be noted that a second end of the MTJ sensor in each of the p-MTJ cells is coupled to a source terminal of the transistor in the same p-MTJ cell. The program code is also executable by the processor to cause the processor to perform the process which additionally includes: monitor, by the processor, the activated subset of p-MTJ cells; determine, by the processor, whether any of the activated p-MTJ cells have failed; and in response to determining that an activated p-MTJ cell has failed, physically locate, by the processor, the failed p-MTJ cell.

Other aspects and advantages of the present invention will become apparent from the following detailed description, which, when taken in conjunction with the drawings, illustrate by way of example the principles of the invention.

DETAILED DESCRIPTION

Figure 1:
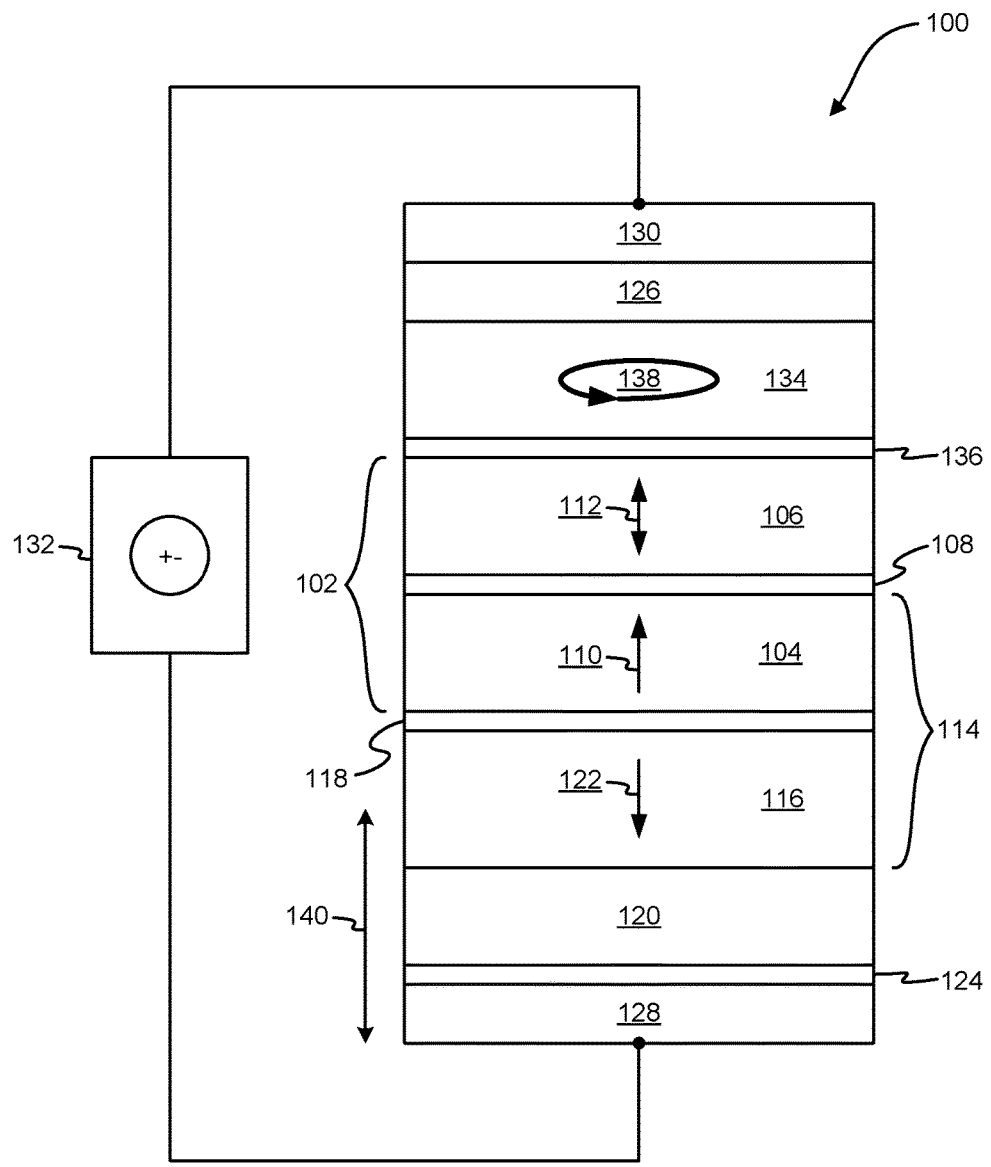
FIG. 1 is a representational view of a sensor stack for a memory element according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of efficiently testing the endurance of tunnel barrier layers used in cells of MRAM and/or related systems and methods. Moreover various approaches described herein may be able to predict an effective lifespan of a MRAM array based on results of the testing conducted on the MRAM cells, e.g., as will be described in further detail below.

In one general embodiment, a processor-implemented method for testing memory cell endurance includes: activating a subset of a plurality of perpendicular magnetic tunnel junction (p-MTJ) cells oriented in one or more columns of a MRAM array. Each of the p-MTJ cells includes a transistor and a magnetic tunnel junction (MTJ) sensor. Moreover, activating the subset of p-MTJ cells includes: applying a first voltage to a gate terminal of the transistor in each of the p-MTJ cells in the subset in parallel, applying a second voltage to a first end of the MTJ sensor in each of the p-MTJ cells in the subset in parallel, and applying a third voltage to a drain terminal of the transistor in each of the p-MTJ cells in the subset in parallel. A second end of the MTJ sensor in each of the p-MTJ cells is coupled to a source terminal of the transistor in the same p-MTJ cell. The processor-implemented method also includes: monitoring the activated subset of p-MTJ cells, determining whether any of the activated p-MTJ cells have failed, and in response to determining that an activated p-MTJ cell has failed, physically locating the failed p-MTJ cell.

In another general embodiment, a computer program product includes a non-transitory computer readable storage medium, the computer readable storage medium having program code stored thereon. Moreover, the program code is executable by a processor to cause the processor to perform a process which includes: activate, by the processor, a subset of a plurality of p-MTJ cells oriented in one or more columns of a MRAM array. Each of the p-MTJ cells includes a transistor and a MTJ sensor. Furthermore, activating the subset of p-MTJ cells includes: apply, by the processor, a first voltage to a gate terminal of the transistor in each of the p-MTJ cells in the subset in parallel; apply, by the processor, a second voltage to a first end of the MTJ sensor in each of the p-MTJ cells in the subset in parallel; and apply, by the processor, a third voltage to a drain terminal of the transistor in each of the p-MTJ cells in the subset in parallel. It should be noted that a second end of the MTJ sensor in each of the p-MTJ cells is coupled to a source terminal of the transistor in the same p-MTJ cell. The program code is also executable by the processor to cause the processor to perform the process which additionally includes: monitor, by the processor, the activated subset of p-MTJ cells; determine, by the processor, whether any of the activated p-MTJ cells have failed; and in response to determining that an activated p-MTJ cell has failed, physically locate, by the processor, the failed p-MTJ cell.

As previously mentioned, MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

Spin transfer torque or spin transfer switching, uses spin-aligned (polarized) electrons to change the magnetization orientation of the free layer in the MTJ. In general, electrons possess a spin, which is a quantized amount of angular momentum intrinsic to the electron. An electrical current is generally not polarized, in that it generally includes of 50% spin up and 50% spin down electrons. However, passing a current though a magnetic layer polarizes electrons in the current with the spin orientation corresponding to the magnetization direction of the magnetic layer. Thus, the magnetic later acts as a polarizer and produces a spin-polarized current as a result. Moreover, if a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, thereby effectively writing either a logical "1" or a logical "0" based on whether the free layer is in the parallel or anti-parallel states relative to the reference layer.

Referring to FIG. 1, an illustrative sensor stack for a MTJ memory element 100 is shown according to one embodiment. The MTJ memory element 100 may be used in a p-MTJ memory element, as described in various embodiments herein. The MTJ memory element 100 may include a MTJ 102 that may include a magnetic reference layer 104, a magnetic free layer 106, and a thin, non-magnetic, electrically-insulating magnetic tunnel barrier layer 108 positioned between the reference layer 104 and the free layer 106 in a layer thickness direction 140. The tunnel barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic keeper layer 116 and a non-magnetic, antiparallel coupling layer 118 positioned between the keeper layer 116 and the reference layer 104 in the thickness direction 140. The antiparallel coupling layer 118 may include any suitable material known in the art, such as Ru, and may be constructed to have a thickness that causes ferromagnetic antiparallel coupling of the keeper layer 116 and the reference layer 104.

In one approach, the keeper layer 116 may be exchange coupled with an antiferromagnetic layer 120, which may include any suitable material known in the art, such as IrMn. Exchange coupling between the antiferromagnetic layer 120 and the keeper layer 116 strongly pins the magnetization 122 of the keeper layer 116 in a first direction. The antiparallel coupling between the keeper layer 116 and the reference layer 104 pins the magnetization 110 of the reference layer 104 in a second direction opposite to the direction of magnetization 122 of the keeper layer 116.

According to one approach, a seed layer 124 may be positioned below the keeper layer 116 in the thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the MTJ memory element 100, respectively, in one approach. The lower electrode 128 and the upper electrode 130 may be constructed of a non-magnetic, electrically conductive material of a type known in the art, such as TaN, TiN, W, etc., and may provide an electrical connection with a circuit 132. The circuit 132 may include a current source, and may further include circuitry for reading an electrical resistance across the MTJ memory element 100.

The magnetic free layer 106 has a magnetic anisotropy that causes the magnetization 112 of the free layer 106 to remain stable in one of two directions perpendicular to the horizontal plane of the free layer 106. In a write mode of use for the MTJ memory element 100, the orientation of the magnetization 112 of the free layer 106 may be switched between these two directions by applying an electrical current through the MTJ memory element 100 via the circuit 132. A current in a first direction causes the magnetization 112 of the free layer 106 of the MTJ memory element 100 to flip to a first orientation, and a current in a second direction opposite to the first direction causes the magnetization 112 of the free layer 106 of the MTJ memory element 100 to flip to a second, opposite direction.

For example, if the magnetization 112 is initially oriented in an upward direction in FIG. 1, applying a current in a downward direction through the MTJ memory element 100 causes electrons to flow in an opposite direction upward through the MTJ memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the MTJ memory element 100 in an upward direction in FIG. 1 causes electrons to flow in an opposite direction, downward through the MTJ memory element 100. However, because the magnetization 112 of the free layer 106 is opposite to the magnetization 110 of the reference layer 104, the electrons will not be able to pass through the tunnel barrier layer 108. As a result, the electrons (which have been spin polarized by the magnetization 112 of the free layer 106) will accumulate at the junction between the free layer 106 and the tunnel barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the MTJ memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a processional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the MTJ memory element 100.

The MTJ memory element 100 described in FIG. 1 is intended to provide context to the various embodiments described herein. The structures and methods described herein in accordance with various embodiments may include a portion of the MTJ memory element 100 described in FIG. 1 and/or used in conjunction with the MTJ memory element 100, in various approaches.

It should be noted that the MTJ sensor stack configuration illustrated in FIG. 1 is in no way intended to limit the invention. Rather, the sensor stack included in MTJ memory element 100 of FIG. 1 is presented by way of example only. Accordingly, any of the embodiments described herein which include reference to a MTJ structure (e.g., sensor stack) may implement a MTJ sensor structure similar to or the same as that shown in FIG. 1, or any other MTJ sensor structure which would be apparent to one skilled in the art after reading the present description.

A MTJ sensor stack, e.g., such as that illustrated in FIG. 1, may be electrically coupled with a transistor in order to write information to the MTJ sensor stack such that the information is stored in the sensor stack itself. As previously mentioned, information may be written (or overwritten) to a MTJ sensor stack by causing the magnetic orientation of the free layer to flip. Moreover, flipping the magnetic orientation of the free layer may be achieved by selectively passing a current through the sensor stack, e.g., as will be described in further detail below.

Figure 2:
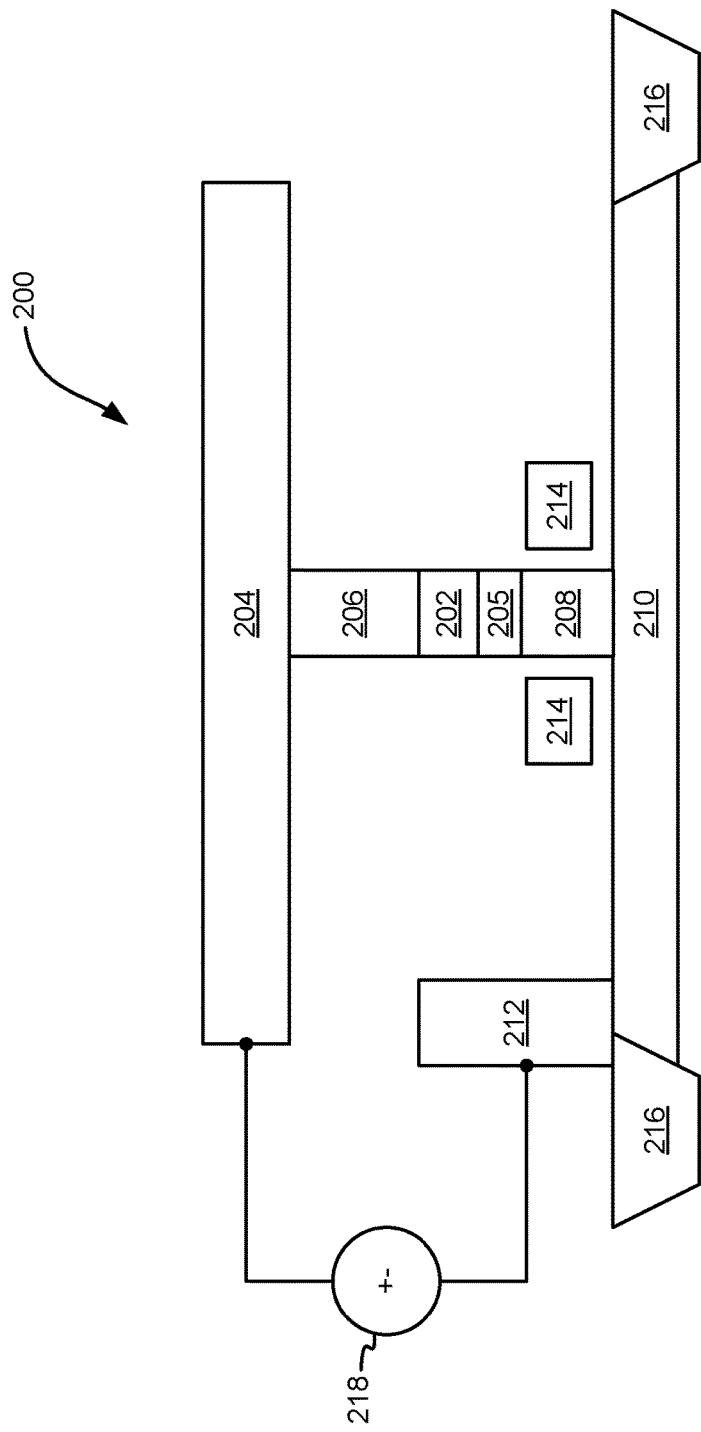
FIG. 2 is a schematic view of a memory cell according to one embodiment.

Looking now to FIG. 2, a portion of a MRAM cell 200 that includes a p-MTJ sensor stack 202 is shown according to one embodiment. The MRAM cell 200 may be operated and utilized as understood by those of skill in the art, with any special use cases being specified in accordance with an embodiment herein. The memory element 100 described in FIG. 1 may be used as the magnetoresistive sensor stack 202 of FIG. 2 in accordance with embodiments that store data in MRAM. In one embodiment, an MTJ element may be used as the magnetoresistive sensor stack 202. Moreover, although the embodiment illustrated in FIG. 2 includes a MRAM cell 200 which includes a vertical transistor, it should also be noted that a vertical transistor is in no way required, but rather has been presented by way of example. Accordingly, the any type of transistor structure may be implemented depending on the desired approach, e.g., as would be appreciated by one skilled in the art after reading the present description.

The MRAM cell 200 also includes a bit line 204 that supplies current across the magnetoresistive sensor stack 202 from a current source 218. The bit line 204 may include any suitable material known in the art, such as TaN, W, TiN, Au, Ag, Cu, etc. An extension layer 206 electrically connects the magnetoresistive sensor stack 202 with the bit line 204. The extension layer 206 may include any suitable material known in the art, such as Ru, Ta, etc. A source terminal 205 is coupled between the magnetoresistive sensor stack 202 and a channel layer 208, the channel layer 208 further being in electrical contact with a n+ layer 210. The channel layer 208 may include any suitable semiconductor material known in the art, such as Si, Ge, GaAs-compounds, etc. The n+ layer 210 may include any suitable material known in the art, such as TaN, W, TiN, Au, Ag, Cu, etc., and is electrically connected to the voltage source 218 via a source line 212, which may include any suitable material known in the art, such as TaN, W, TiN, Au, Ag, Cu, etc. Positioned across the channel layer 208 is a word line 214 which may include any suitable material known in the art, such as TaN, W, TiN, Au, Ag, Cu, etc. On either side of the n+ layer 210 are shallow trench isolation (STI) layers 216 which provide electrical insulation between adjacent ones of the n+ layer 210 although only one n+ layer 210 is shown in the present embodiment. Moreover, although not specifically shown, electrically insulative material may be positioned around the various layers shown in FIG. 2, as would be understood by one of skill in the art.

Figure 3A:
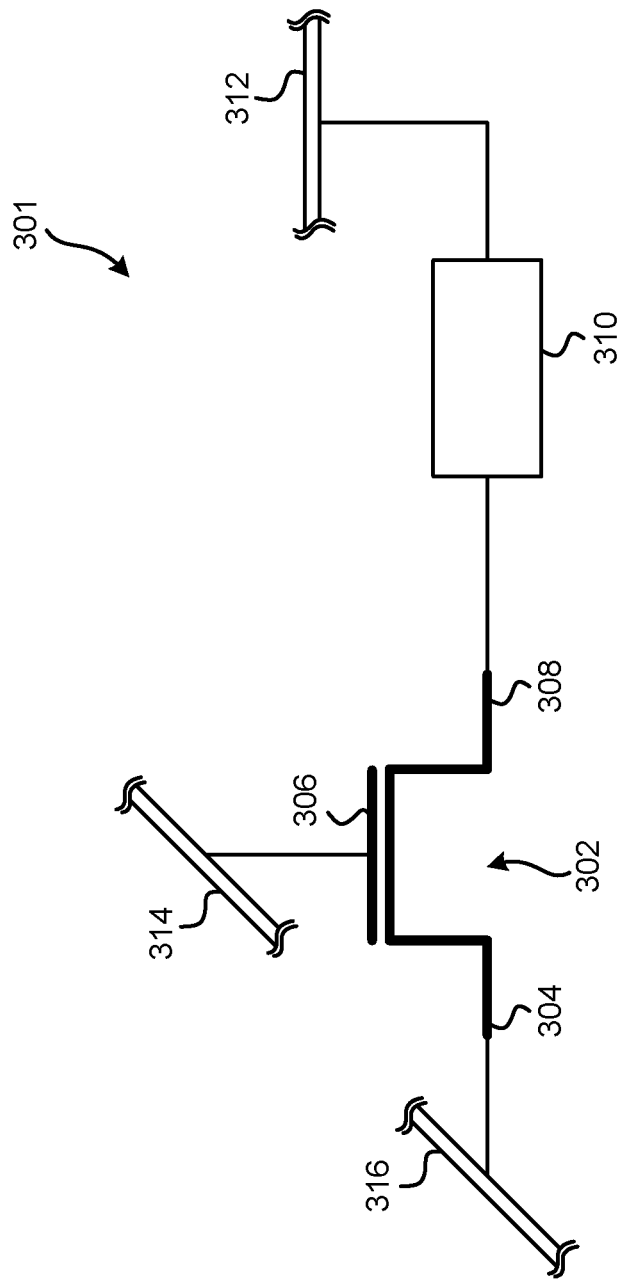
FIG. 3A is a schematic view of a p-MTJ cell according to one embodiment.

Looking now to FIG. 3A, a basic schematic view of a perpendicular MTJ (p-MTJ) cell 301 of memory is illustrated in accordance with one embodiment. As an option, the present p-MTJ cell 301 may be implemented in conjunction with features from any other embodiment listed herein, such as those described with reference to the other FIGS., e.g., such as FIG. 1. Of course, however, such p-MTJ cell 301 and others presented herein may be used in various applications and/or in permutations which may or may not be specifically described in the illustrative embodiments listed herein. Further, the p-MTJ cell 301 presented herein may be used in any desired environment.

As shown, the p-MTJ cell 301 includes a transistor 302 which has a drain terminal 304, a gate terminal 306, and a source terminal 308. Moreover, a MTJ sensor stack 310 is electrically coupled to both the source terminal 308 of the transistor structure 302 as well as a bit line 312. The gate terminal 306 is also shown as being electrically coupled to a word line 314, while the drain terminal 304 is electrically coupled to a source line 316. Each of the bit line 312, the word line 314 and the source line 316 are preferably able to supply a voltage to a respective terminal of the transistor structure 302 in order to induce or inhibit a current from flowing through the transistor structure 302. Moreover, although the drain terminal 304 and source terminal 308 are labeled as shown in FIG. 3A, it should be noted that the source and drain terminals may be interchangeable in approaches where both terminals include (are) n+ doped regions, e.g., from a material composition point of view. However, a voltage is applied to one of the terminals 304, 308 which is a higher voltage than a voltage applied to the other of the terminals 304, 308, the terminal having a higher voltage bias applied thereto will effectively be the drain terminal and the other of the two terminals having the lower voltage bias applied thereto will effectively be the source terminal, e.g., as would be appreciated by one skilled in the art after reading the present description.

It follows that the combination of signals (voltages) applied to each of the terminals 304, 306, 308 of the transistor structure 302 may be selectively adjusted in order to ultimately control whether a current is applied to the MTJ sensor stack 310 coupled to the source terminal 308, and in which direction. Thus, the signals passed through each of the terminals 304, 306, 308 may ultimately control the spin of electrons in a free layer of the sensor stack 310, thereby writing either a logical "1" or logical "0" thereto, e.g., as described above. Accordingly, the resulting structure 301 presented in FIG. 3A may effectively represent a single p-MTJ cell which may be used in MRAM.

It should also be noted that the specific layers which are included in the sensor stack 310 may vary depending on the desired approach. For instance, in some approaches the sensor stack 310 may include the same or a similar structure as the sensor stack of the MTJ memory element 100 illustrated in FIG. 1. However, in other approaches the sensor stack 310 may include any configuration of layers which would be apparent to one skilled in the art after reading the present description.

As described above, an important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density.

In sharp contrast to these restrictions experienced by conventional MRAM storage, various embodiments included herein are able to achieve data storage densities which are much higher than previously possible. By implementing a common (e.g., shared) source line extending between various transistors according to some of the different approaches described below, the resulting memory arrays may provide the desirable performance of MRAM in a compact configuration, e.g., as will be described in further detail below.

Figure 3B:
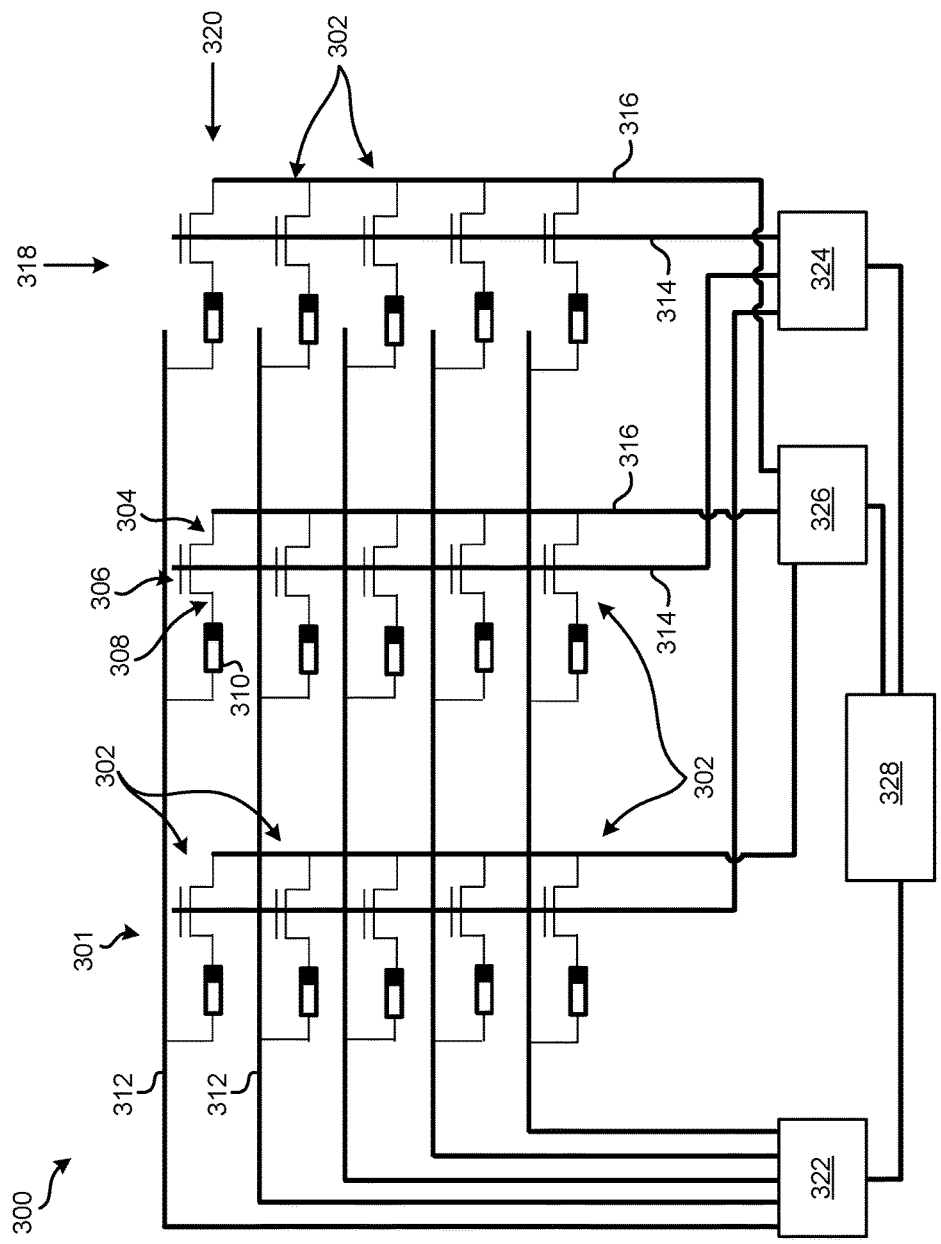
FIG. 3B is a schematic view of a MRAM array having a plurality of the p-MTJ cells in FIG. 3A, according to one embodiment.

Referring now to FIG. 3B, a schematic view of a MRAM array 300 is illustrated in accordance with one embodiment. As an option, the present MRAM array 300 may be implemented in conjunction with features from any other embodiment listed herein, such as those described with reference to the other FIGS., e.g., such as FIGS. 1-3A. Of course, however, such MRAM array 300 and others presented herein may be used in various applications and/or in permutations which may or may not be specifically described in the illustrative embodiments listed herein. Further, the MRAM array 300 presented herein may be used in any desired environment.

As shown, the MRAM array 300 (e.g., magnetic device) includes a plurality of memory cells 301, each of which includes a transistor 302 and a MTJ sensor stack 310. The plurality of memory cells 301 are oriented in a grid-type fashion. Each of the transistors 302 includes a drain terminal 304, a gate terminal 306 and a source terminal 308, respectively. Moreover, each of the transistors is coupled to a MTJ sensor stack 310. According to preferred approaches, each coupled MTJ sensor 310 and transistor 302 pair are a p-MTJ cell. These p-MTJ cells differ from conventional types of memory cells in that terminals of the transistors included in the p-MTJ cells are formed in a vertical fashion along the deposition direction of the transistor structure, rather than perpendicular to the deposition direction. Thus, the transistors in the p-MTJ cells have a significantly smaller footprint compared to conventional transistors, while delivering enough current to MTJ sensor stack. According to some illustrative approaches, the effective cell size of each of the p-MTJ cells may be about 2F×2.5F, or equivalently about $5F^2$, where F represents the minimum feature size defined by the lithography limits associated with the technology used to fabricate each of the p-MTJ cells. Thus, depending on the actual process(es) used to form the various p-MTJ cells, their effective size may vary depending on the value of F. This effective cell size of each of the p-MTJ cells is significantly smaller than conventionally achievable. Having a smaller footprint also allows for a larger number of transistors to be positioned in a given area, thereby increasing storage density, reducing an overall footprint of the memory module, etc.

The MTJ sensor stack 310 is electrically coupled between the source terminal 308 of each of the transistors 302 as well as a respective common bit line 312. Moreover, each of the gate terminals 306 are electrically coupled to a respective common word line 314, while each of the drain terminals 304 are electrically coupled to a respective common source line 316. Each of the common bit line 312, the common word line 314 and the common source line 316 are preferably able to supply voltages to a respective terminal of the various transistors 302 in the MRAM array 300 in order to induce or inhibit a current from flowing through select ones of the transistors 302. Accordingly, the voltages apply to the common bit lines 312, the common word lines 314 and/or the common source lines 316 may control whether a logical "1" or a logical "0" is written to select ones of the MRAM sensor stacks 310 coupled to the various transistors 302. It follows that the combined structure of the transistors 302 and the MRAM sensor stacks 310 may effectively form a "memory cell" as described above. Moreover, the memory cell is able to store one bit of information, i.e., a logical "1" or a logical "0". Thus, the storage capacity of the MRAM array 300 may effectively be defined by the number of transistor 302 and MTJ sensor stack 310 pairings (or p-MTJ cells) included therein.

With continued reference to FIG. 3B, the various different memory cells 301 are arranged in a grid-like fashion. In other words, the different memory cells 301 are oriented in rows and columns which are substantially perpendicular to each other. This grid-like organization of the different memory cells 301 provides an efficient use of space and allows for the memory density of the resulting MRAM array 300 to be maximized. However, it should be noted that this grid-like arrangement of the memory cells 301 shown in FIG. 3B is in no way intended to limit the invention. Rather, the memory cells 301 and/or any of the lines 312, 314, 316 may be arranged differently depending on the desired approach.

As mentioned above, the grid-like arrangement of the transistors 302 forms distinct columns 318 and rows 320 which extend throughout the MRAM array 300. Moreover, the columns 318 and rows 320 are interleaved such that each of the transistors 302 are part of a defined row as well as a defined column. Thus, a specific one of the transistors may be individually identified given the row and column which it is located in. Although only three columns 318 and five rows 320 are illustrated in the present embodiment, any desired number of rows and/or columns may be implemented in order to scale the size of (e.g., the number of memory cells in) the MRAM array 300, and thus the storage capacity of the MRAM array 300. According to an example, hundreds, thousands, millions, etc. of p-MTJ cells (transistor 302 and MTJ sensor stack 310 pairings) may be organized in various rows and columns which extend perpendicularly relative to each other.

Each of the common bit lines 312, the common word lines 314 and the common source lines 316 are illustrated as being coupled to (e.g., in electrical communication with) a multiplexer 322, 324, 326 respectively. Moreover, each of the multiplexers 322, 324, 326 are coupled to a central controller 328. However, it should be noted that any one or more of these lines 312, 314, 316 may extend to any desired electrical component. Each of the multiplexers 322, 324, 326 may serve as an electrical circuit which is used to control a voltage that is applied to each of the respective lines 312, 314, 316, e.g., using logic gates for instance. Similarly, the controller 328 may be configured to perform various processes which effect the voltages applied by the multiplexers 322, 324, 326 to each of the respective lines 312, 314, 316, and in turn, the different terminals of the various transistors 302.

By acting as a voltage generator, the multiplexers 322, 324, 326 may be configured to counteract signal dampening experienced in the respective lines 312, 314, 316 coupled thereto. In other approaches, one or more of the multiplexers 322, 324, 326 may serve as a sense amplifier in addition to a voltage generator. As a result, each of the multiplexers 322, 324, 326 may be able to perform a read operation by receiving a signal from various ones of the transistors 302, as well as perform write operations by applying a desired voltage to the respective lines 312, 314, 316 coupled thereto. Although each of the common source lines 316 are shown as being coupled to the same multiplexer 326 in FIG. 3B, it may be preferred that a sense amplifier enabled multiplexer circuit be coupled to each of the respective common source lines 316. Accordingly, in some approaches each of the common source lines 316 may be coupled to a different sense amplifier enabled multiplexer.

When forming memory elements such as those shown above, process variability and fabrication imperfections may cause the characteristics of the resulting structure to have an effective resistance, thickness, surface roughness, etch profile, etc. that is different than intended. It follows that quality control for these memory element structures has an important effect on the performance of the formed structure. However, the process of determining the quality of MTJ sensors has conventionally proven to be a difficult challenge. For instance, conventional processes employed to determine the quality of MgO tunnel junction layers in MTJ sensors are themselves destructive. Thus, it is not practical to perform quality testing on main memory arrays of a given product using conventional processes. In fact, there are no conventional procedures that are able to effectively ensure endurance MRAM based memory products. A survey of these conventional procedures reveal that conventional testing of endurance stress for floating gates involves collapsing the margin between an erased state and a programmed state. However, this repeated tunneling and hot carrier in and out of floating gate create interface states, which deteriorates the programming and/or erasing efficiency of the memory itself. Moreover, other nonvolatile memory testing procedures all suffer from a lack of predicting endurance characteristics.

Furthermore, variations resulting during fabrication may have a relatively localized effect in some instances, while in others the variations may affect the resulting structure on more of a global scale depending on the cause of the variation which occurred. One such causes of variation includes point defects and/or clusters during layer deposition which will affect local thicknesses of the deposited layer around the point defects. Another cause of variation includes variation in the deposition condition of the chamber, e.g., including gas flow rates, pressure control, deposition temperature, RF plasma, etc.

In sharp contrast to the aforementioned conventional shortcomings, various approaches introduced herein provide efficient and effective ways of detecting and/or predicting sensor quality as well as endurance (e.g., effective lifetime). Considering that endurance is a key characteristic for memory products, some of the approaches included herein may desirably be implemented in a number of different fabrication settings, e.g., particularly mass-manufacturing environments. It follows that some of the approaches described herein may be implemented to test and/or predict the quality of fabricated memory structures. Accordingly, quality control of these memory structures may be significantly improved, thereby resulting in higher quality of the resulting systems that implement these memory structures, e.g., as will be described in further detail below.

Figure 4A:
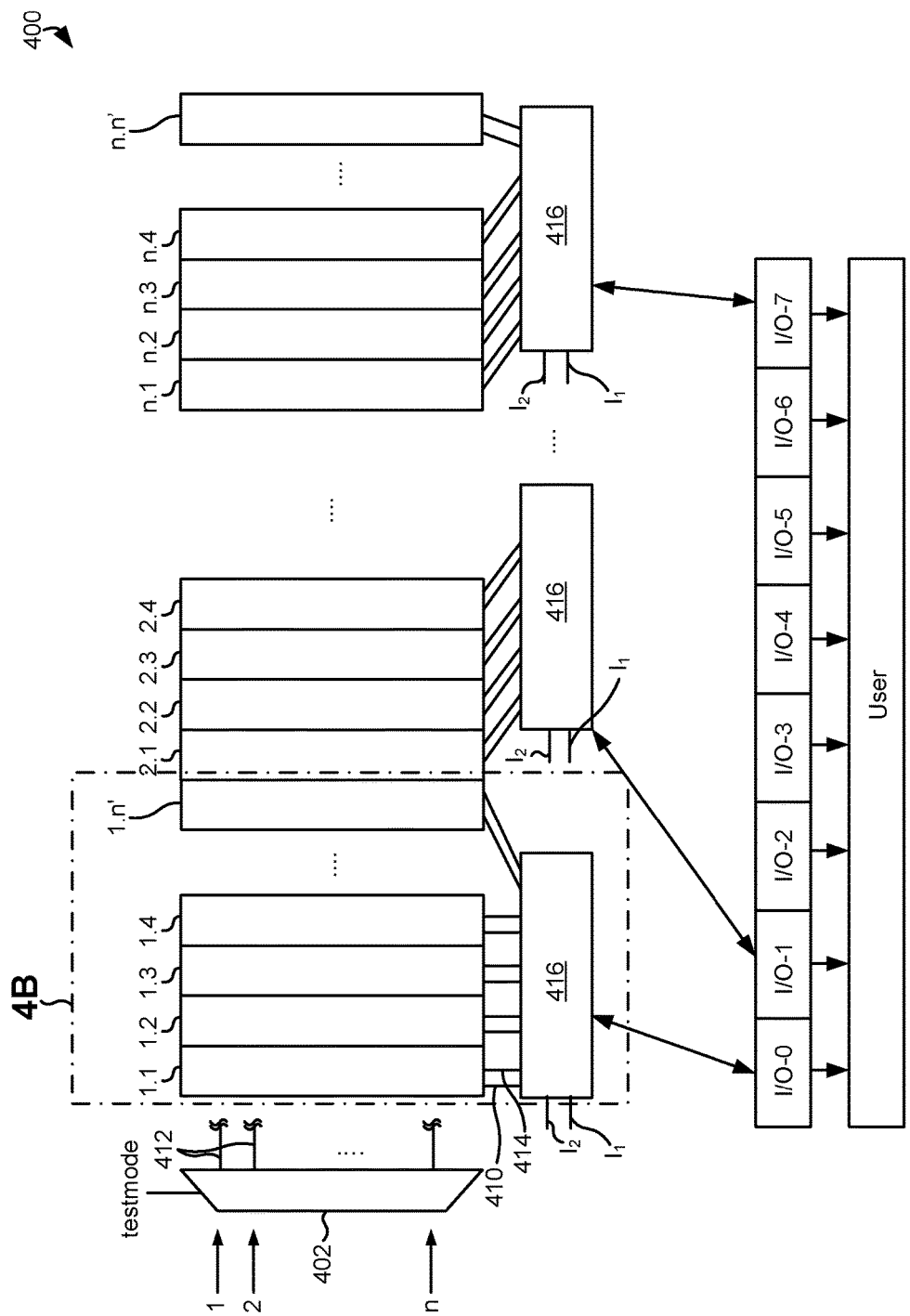
FIG. 4A is a partial schematic view of a MRAM array having a plurality of the p-MTJ cells according to one embodiment.
Figure 4B:
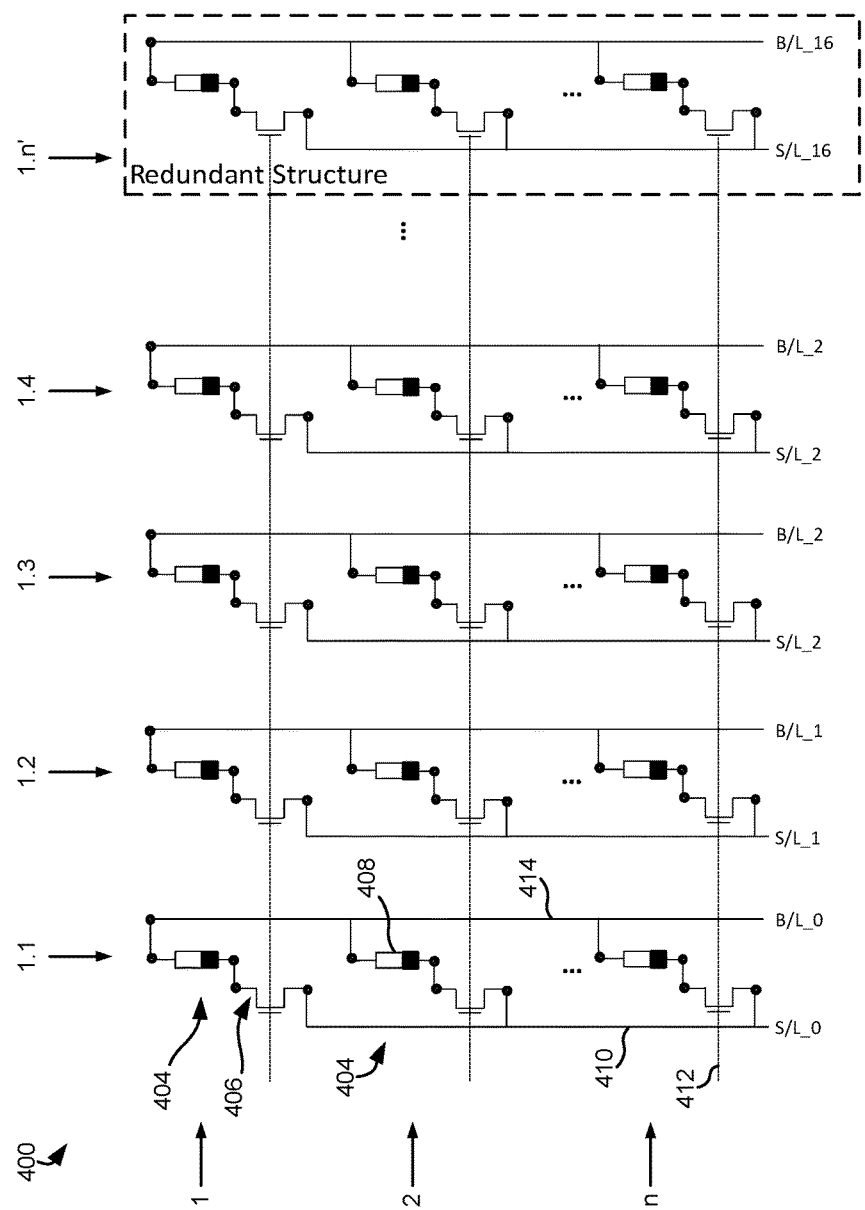
FIG. 4B is a detailed view of the MRAM array in FIG. 4A taken inside the dashed box labeled 4B according to one embodiment.

Looking now to FIG. 4A, a partial representational view of a MRAM array 400 is illustrated in accordance with one embodiment. Moreover, FIG. 4B illustrates a detailed view of a portion of the MRAM array 400 taken along the dashed box labeled 4B. As an option, the present MRAM array 400 may be implemented in conjunction with features from any other embodiment listed herein, such as those described with reference to the other FIGS., e.g., such as FIGS. 1-3B. Of course, however, such MRAM array 400 and others presented herein may be used in various applications and/or in permutations which may or may not be specifically described in the illustrative embodiments listed herein. Further, the MRAM array 400 presented herein may be used in any desired environment.

As shown in FIG. 4A, the MRAM array 400 includes a plurality of columns 1.1, 1.2, 1.3, 1.4; 2.1, 2.2, 2.3, 2.4; n.1, n.2, n.3, n.4, which are oriented adjacent to each other in series. Moreover, subsets of the columns are separated by redundant columns which may be interspersed throughout the MRAM array 400. Specifically, redundant columns 1.n' and n.n' are shown as being positioned along the plurality of columns in series. These redundant columns 1.n', n.n' thereby effectively separate subsets of the plurality of columns which are numbered accordingly. For example, a first redundant column 1.n' separates a first subset of columns (numbered using a "1" prefix) from a second subset of the columns (numbered using a "2" prefix). Although not visible in the view shown in FIG. 4A, each of the columns included in the MRAM array 400 preferably include a plurality of memory cells. For instance, referring momentarily to the detailed view in FIG. 4B, each of columns 1.1, 1.2, 1.3, 1.4 as well as redundant column 1.n' include p-MTJ cells 404 of memory, each of which includes a transistor 406 and a MTJ sensor stack 408 coupled to a source terminal of the transistor 406. It should be noted that this numbering scheme corresponds to the assumption that there are n−1 "normal" (non-redundant) columns per I/O line, that the $n^{th}$ column in each I/O line is a redundant column, and that there are "n" number of row lines. Thus, 1.n', 2.n', . . . , n.n' are each redundant columns. However, if the column number were "k" as opposed to "n", the redundant columns may be identified as 1.k', 2.k', . . . , n.k'. Moreover, each of the transistors 406 are coupled to a common source line 410 and common word line 412, while the MTJ sensor stack 408 is also coupled to a common bit line 414, e.g., as will be described in further detail below.

Referring back to FIG. 4A, the redundant columns are preferably used to test the quality and endurance of the memory cells included in the redundant columns 1.n', n.n' of the MRAM array 400. As mentioned above, conventional processes are unable to determine the quality of memory cells, as these conventional processes are themselves physically destructive to the memory elements. Thus, it is not practical to perform quality testing on main memory arrays of a given product using conventional processes. In sharp contrast, by providing a desired number of redundant memory cells in the MRAM array 400 of FIG. 4A, various approaches included herein are able to overcome these conventional shortcomings, e.g., as will soon become apparent.

By forming a MRAM array 400 having redundant columns 1.n', n.n' in the main array, exhaustive endurance testing may be performed on redundant memory cells that were actually fabricated alongside the remaining "normal" cells of the MRAM array 400 without degrading the performance eventually experienced by a user. It should be noted that "redundant" as used herein is intended to signify memory cells that are fabricated using a same or similar manner as the remainder of the memory cells in a memory array, but which are configured to only be activated while testing the memory array. Alternatively, "normal" as used herein is intended to signify memory cells which are not activated (and therefore not effected) during testing processes of the redundant memory cells in the same memory array, but which are configured to store memory during normal use of the array. In other words, by implementing redundant memory cells which are different than the memory cells which will ultimately be used throughout the lifetime of the MRAM array 400, these redundant cells may be used in a sacrificial manner to conduct quality control testing without effecting the remainder of the memory cells and/or the performance of the memory array as a whole.

Accordingly, it is also preferred that the redundant memory cells are tested before a remainder of the p-MTJ cells in the MRAM array (which are not redundant) have been written to. In other words, the redundant memory cells are preferably tested after fabrication, but while the remaining memory cells do not have any data (e.g., logical "1" or "0") written thereto. Thus, although the magnetic orientation of the free layer in each of the other "normal", non-redundant cells may technically be oriented in one of two states which corresponds to either a logical "1" or a logical "0" bit of data that could be determined if they were to actually be read, none of the "normal", non-redundant cells have actually been written to. This is because the testing of the redundant cells is preferably performed after fabrication and before the MRAM array it is sent out for actual use (e.g., storing data).

As described above, variations caused during fabrication of a memory array may have a relatively localized effect in some instances, while in others the variations may affect the resulting memory array on more of a global scale depending on the type of variation(s) which occurred. It follows that the number of redundant columns, positioning of the redundant columns in the memory array, the types of testing procedures performed on the redundant columns, etc. may vary depending on the desired approach. For instance, although only a few redundant columns 1.n', n.n' are actually shown and numbered in FIG. 4A, any number and/or orientation of redundant columns may be included in the MRAM array 400. According to an illustrative approach, one redundant column may be positioned at a leftmost edge of the MRAM array 400 of FIG. 4A, while a second redundant column may be positioned at a rightmost edge of the MRAM array 400. In other approaches, the redundant columns may be interleaved among the "normal" columns of memory cells throughout the MRAM array 400. For example, a redundant column may be inserted (e.g., defined) every certain number of columns. In other words, each redundant column may separate subsets of the "normal" columns of the same or similar sizes. However, any desired number, configuration, orientation, etc. of redundant memory cells may be implemented depending on the desired approach, e.g., as would be appreciated by one skilled in the art after reading the present embodiment.

As mentioned above, the redundant columns of memory cells desirably allow for the memory cells included in the MRAM array 400 to be tested for quality, endurance, performance, etc. According to preferred approaches, the redundant columns are used to test the tunnel junction layer of the MTJ sensor stacks included in each of the memory cells of the redundant columns (e.g., see method 500 of FIGS. 5A-5C below). The tunnel barrier layer typically includes MgO, and therefore the memory cells may be activated and subjected to endurance testing cycles to determine the status of the MgO barrier layer before the MRAM array 400 is cleared or sent out for use.

Referring still to FIG. 4A, one or more logic gates 402 may be used to distribute a supply voltage to the common word lines 412 which are coupled to the gate terminals included in the transistors of the various memory cells in each of the respective rows 1, 2, . . . n. Referring momentarily again to the detailed view in FIG. 4B, the various memory cells 404 may be positioned in a grid-like arrangement which forms distinct columns 1.1, 1.2, 1.3, 1.4, . . . 1.n' and rows 1, 2, . . . n which extend throughout the MRAM array 400. Moreover, the columns 1.1, 1.2, 1.3, 1.4, . . . 1.n' and rows 1, 2, . . . n are interleaved such that each of the transistors memory cells 404 are part of a defined row as well as a defined column. It follows that a specific one of the memory cells may be individually identified given the row and column which it is located in.

Upon receiving a testmode signal, the logic gate 402 may apply a supply voltage to each of the common word lines 412, which again are coupled to the gate terminals of the various transistors 406. Furthermore, a multiplexer 416 may be coupled to the common supply line 410 and common bit line 414 of each of the redundant columns and a corresponding subset of the "normal" columns. For example, the leftmost multiplexer 416 in FIG. 4A is coupled to the common supply line 410 and common bit line 414 of redundant column 1.n' as well as the "normal" columns 1.1, 1.2, 1.3, 1.4. Each of the multiplexers 416 also include two inputs. One of the multiplexer 416 inputs $I_1$ may be a same signal as the testmode signal received by the logic gate 402, while the second multiplexer 416 input $I_2$ may be a some sort of control signal. According to one example, which is in no way intended to limit the invention, the control signal provided to a given multiplexer 416 may be Vdec(0:15) which is a decoded control signal based on column addresses, A(0:3).

Furthermore, each of the multiplexer 416 are also coupled to a respective Input/Output (I/O) module I/O-0 through I/O-7. The I/O modules are further in communication with a user, and may therefore receive information from and/or provide information to the user. However, in other approaches one or more of the I/O modules I/O-0 through I/O-7 may be coupled to a controller, a user interface, another multiplexer, etc., depending on the desired approach. Moreover, it should be noted that although only eight I/O modules are shown in the present embodiment, this is in no way intended to limit the invention. Rather, any desired number of I/O modules may be implemented in the present embodiment, e.g., depending on a size of the MRAM array 400, a number of redundant columns included in the MRAM array 400, user preference, etc.

As described above, it is preferred that only the redundant memory cells in the redundant columns are tested during a testing phase of the memory array. Accordingly, it is preferred that the multiplexers 416 are configured to only activate the transistors in the redundant memory cells of the redundant columns. Activating only certain select transistors that are included in a grid and coupled to various other transistors by common voltage lines may involve applying certain voltages to the different transistor terminals. For instance, although the logic gate 402 may apply a same voltage to all common word lines 412 in the memory array 400, by using the multiplexers 416 to selectively apply different voltages to the common supply line 410 and common bit line 414 of each of the respective columns coupled thereto, only the transistors in the redundant column may be activated, while the transistors included in a remainder of the columns coupled to the same multiplexer 416 desirably remain not activated. Accordingly, redundant memory cells in the redundant columns may undergo a number of different tests designed to simulate use without effecting the rest of the cells included in the MRAM array 400.

The tests applied to the selectively activated redundant memory cells may vary depending on the approach. For instance, the test(s) applied to the redundant memory cells may vary in the rate at which the flow of current through the corresponding transistor and MTJ sensor stack is flipped (e.g., the rate at which the memory cell is rewritten), the voltage amplitude, run time, etc. Moreover, the results of the test(s) applied to the redundant memory cells in the redundant columns may be further used to determine (e.g., extrapolate) a status of the corresponding MRAM array as a whole, e.g., as will be described in further detail below.

Figure 5A:
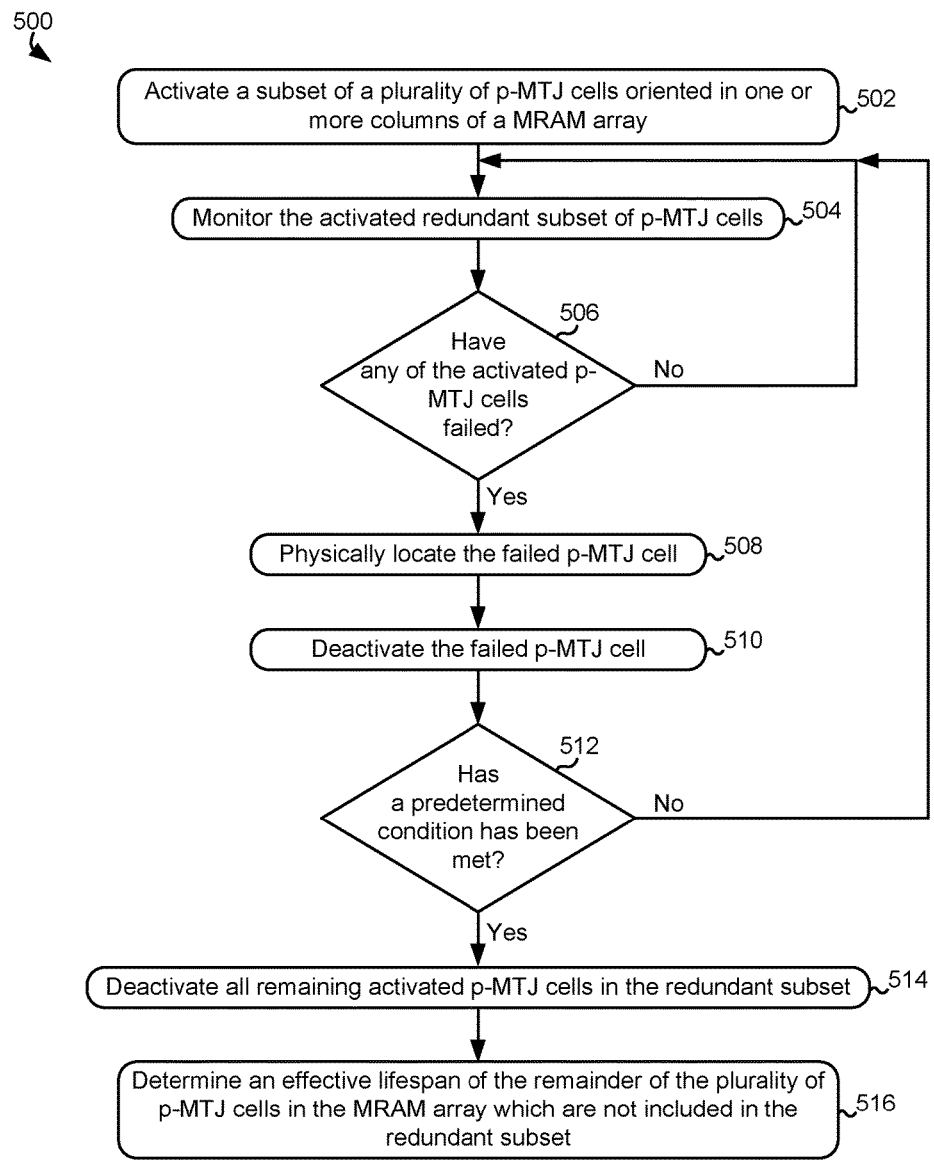
FIG. 5A is a flowchart of a method according to one embodiment.

Referring now to FIG. 5A, a flowchart of a method 500 for testing redundant memory cells in a memory array is illustrated in accordance with one embodiment. The method 500 may be performed in accordance with the present invention in any of the environments depicted in FIGS. 1-4B, among others, in various embodiments. Of course, more or less operations than those specifically described in FIG. 5A may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller (e.g., see controller 328 in FIG. 3B), or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown, method 500 may initiate with operation 502 which includes activating a subset of a plurality of p-MTJ cells oriented in one or more columns of a MRAM array. Each of the p-MTJ cells may include a transistor and a MTJ sensor. Moreover, it is preferred that the subset of the plurality of p-MTJ cells which are activated in operation 502 are redundant cells of memory. Accordingly, the subset activated in operation 502 may also be referred to herein as the "redundant subset". The redundant cells may be oriented in one or more same redundant column of the memory array which may be positioned at different locations throughout the MRAM array. For example, in some approaches one of the redundant columns may be positioned at a first end of the MRAM array, while a second of the redundant columns is positioned at a second end of the MRAM array opposite of the first end. In other approaches, every $N^{th}$ column of the MRAM array may be one of the redundant columns having redundant memory cells therein (e.g., as shown in FIGS. 4A-4B). However, it should be noted that the redundant cells activated in operation 502 may be oriented in any desired manner throughout the memory array. For example, the redundant cells of memory may be oriented in one or more common rows.

Figure 5B:
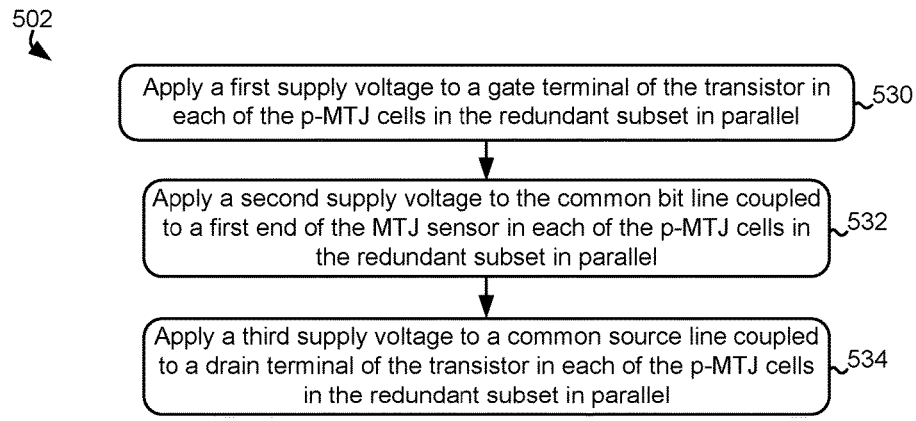
FIG. 5B is a flowchart of sub-operations included in an operation of the method of FIG. 5A according to one embodiment.

Referring momentarily to FIG. 5B, exemplary sub-processes of activating a redundant subset of p-MTJ cells of memory are illustrated in accordance with one embodiment, one or more of which may be used to perform operation 502 of FIG. 5A. However, it should be noted that the sub-processes of FIG. 5B are illustrated in accordance with one embodiment which is in no way intended to limit the invention.

As previously mentioned, each of the p-MTJ cells may include a transistor which includes a drain terminal, a source terminal and a gate terminal. Moreover, a common source line may be coupled to the drain terminal of the transistor in each of the p-MTJ cells which are oriented in a same column, while a common word line is coupled to the gate terminal of the transistor in each of the p-MTJ cells in the redundant subset which are oriented in the same column. Furthermore, a common bit line may be coupled to the MTJ sensor structure which is in turn applied to the source terminal of the transistor in each of the p-MTJ cells.

Accordingly, the sub-processes in FIG. 5B include applying a first supply voltage to a gate terminal of the transistor in each of the p-MTJ cells in the redundant subset in parallel. See sub-operation 530. Moreover, sub-operation 532 includes applying a second supply voltage to the common bit line coupled to a first end of the MTJ sensor in each of the p-MTJ cells in the redundant subset in parallel. Finally, sub-operation 534 includes applying a third supply voltage to a common source line coupled to a drain terminal of the transistor in each of the p-MTJ cells in the redundant subset in parallel. It should be noted that each of the sub-operations included in FIG. 5B are preferably performed in parallel (e.g., simultaneously) because activating even one cell of MRAM involves applying a given voltage to all three terminals of the transistor in the cell, e.g., as would be appreciated by on skilled in the art after reading the present description. Thus, although the various sub-operation in FIG. 5B are shown in a flowchart, each of the sub-operations are preferably performed at the same time. Alternatively, the voltages applied in each of the sub-operations may remain on (e.g., applied to the respective line/terminal of the transistor) until all sub-operations in FIG. 5B are performed, thereby achieving effectively the same result.

It should also be noted that it is preferred that the redundant subset of p-MTJ cells are activated in operation 502 for testing before a remainder of the p-MTJ cells in the MRAM array (the "normal cells") have been written to at all. In other words, the redundant memory cells are preferably activated for testing and actually tested after fabrication, but while the remaining memory cells have not had any unique data (e.g., logical "1" or "0") written thereto. Thus, although the magnetic orientation of the free layer in each of the other "normal", non-redundant cells may technically be oriented in one of two states which corresponds to either a logical "1" or a logical "0" bit of data that could be determined if they were to actually be read, none of the "normal", non-redundant cells have actually been written to. This is because the testing of the redundant cells is preferably performed after fabrication and before the MRAM array it is sent out for actual use (e.g., storing data).

Returning to FIG. 5A, operation 504 includes monitoring the activated redundant subset of p-MTJ cells, while decision 506 includes determining whether any of the activated p-MTJ cells have failed. Once the transistor of a p-MTJ cell has been activated, an electrical current is applied to the MTJ sensor structure coupled thereto. Moreover, as long as the transistor remains activated, the current remains applied to the MTJ sensor structure. As mentioned above, MTJ sensor structures include a tunnel barrier layer which acts to limit the amount of current that is passed through the sensor while allowing for the magnetic orientation of the free layer to be selectively controlled in order to store information. It follows that the insulative properties of the tunnel barrier layer are crucial to the performance of the cell as a whole. Once the tunnel junction layer degrades to the point that an electrical short spans between the free layer and the reference layer, current is able to flow through the sensor stack unchecked and the corresponding memory cell is effectively rendered useless. Thus, determining whether any of the activated p-MTJ cells have failed may include monitoring the current being passed through the redundant columns for spikes in current, e.g., as would be appreciated by one skilled in the art after reading the present description.

As shown, method 500 proceeds to operation 508 in response to determining that at least one of the activated p-MTJ cells has failed. There, operation 508 includes physically locating the failed p-MTJ cell. A failed p-MTJ cell is preferably located such that the supply voltages being applied thereto may be adjusted such that the transistor in the failed p-MTJ cell is no longer activated. Once the transistor is no longer activated, no current will flow through that cell despite the tunnel barrier layer possibly being shorted, and a remainder of the redundant cells of the MRAM array may continue to be tested.

Figure 5C:
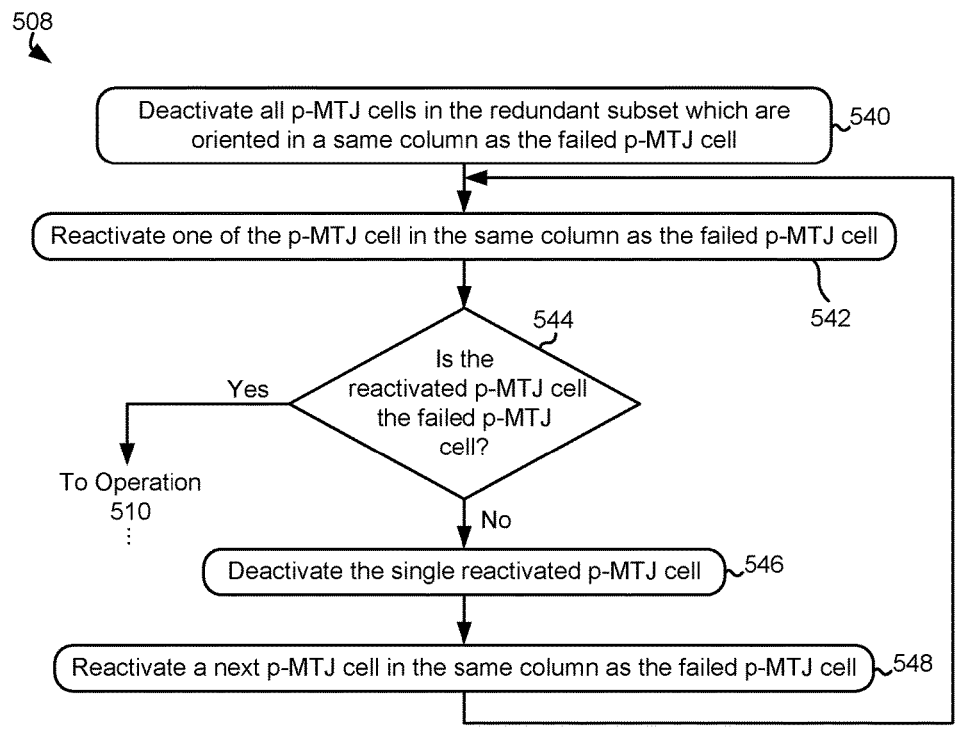
FIG. 5C is a flowchart of sub-operations included in an operation of the method of FIG. 5A according to one embodiment.

Looking to FIG. 5C, exemplary sub-processes of physically locating a failed p-MTJ cell are illustrated in accordance with one embodiment, one or more of which may be used to perform operation 508 of FIG. 5A. However, it should be noted that the sub-processes of FIG. 5C are illustrated in accordance with one embodiment which is in no way intended to limit the invention.

As shown, the flowchart of FIG. 5C includes deactivating all p-MTJ cells in the redundant subset which are oriented in a same column as the failed p-MTJ cell. See sub-operation 540. According to an illustrative approach, this deactivation may be performed by terminating the second voltage that has been applied to each of the common word lines. However, in other approaches the p-MTJ cells oriented in the same column as the failed p-MTJ cell may be deactivated in another manner, e.g., such that redundant cells positioned in other columns may continue to be tested.

Furthermore, sub-operation 542 includes reactivating one of the p-MTJ cell in the same column as the failed p-MTJ cell, while decision 544 includes determining whether the reactivated p-MTJ cell is the failed p-MTJ cell. As described above, a p-MTJ cell may fail in response to the tunnel barrier layer included therein experiencing an electrical short thereacross. Thus, determining whether an activated p-MTJ cell is operating nominally or whether it has entered a failed state may include sampling an amount of current that is passing through the cell and comparing the sampled current to an intended value.

In response to determining that the reactivated p-MTJ cell is not the failed cell, the flowchart proceeds from decision 544 to sub-operation 546, which includes deactivating the single reactivated p-MTJ cell. Moreover, sub-operation 548 includes reactivating a next p-MTJ cell in the same column as the failed p-MTJ cell. From sub-operation 548, the flowchart returns to decision 544, whereby the next p-MTJ cell activated in sub-operation 548 may be evaluated in order to determine whether it is the failed p-MTJ cell. It follows that decision 544 and sub-operations 546, 548 may be repeated in an iterative fashion until the failed p-MTJ cell is finally physically located in the MRAM array, whereby this iterative loop may be terminated. Accordingly, returning to decision 544, the flowchart in FIG. 5C is illustrated as returning to operation 510 of FIG. 5A in response to determining that the reactivated p-MTJ cell is the failed cell.

Returning to FIG. 5A, operation 510 includes deactivating the failed p-MTJ cell. As noted above, each memory cell in the MRAM array may be located by the row and column in which it is located. Accordingly, in some approaches the failed p-MTJ cell may be physically located by determining the column and row which correspond thereto. Thus, deactivating the failed p-MTJ cell may include adjusting the voltages applied to one or more of the common lines coupled to the different terminals of the physically located cell. As described above, the process of physically locating the failed p-MTJ cell may include deactivating all p-MTJ cells in a column and systematically testing each of the cells one-by-one. Thus, in some approaches operation 510 may actually include reactivating all p-MTJ cells in the column except for the failed p-MTJ cell located in operation 508.

From operation 510, method 500 proceeds to decision 512 which includes determining whether a predetermined condition has been met. According to some approaches the predetermined condition may be met when a certain number of the redundant memory cells being tested have failed. For example, the predetermined condition may be met in response to physically locating a first failed redundant memory cell, a second failed redundant memory cell, a third failed redundant memory cell, a tenth failed redundant memory cell, etc., or any other desired number thereof. In another example, the predetermined condition may be met in response to 1% of the total number of redundant memory cells failing, 5% of the total number of redundant memory cells failing, 10% of the total number of redundant memory cells failing, 25% of the total number of redundant memory cells failing, 50% of the total number of redundant memory cells failing, 100% of the total number of redundant memory cells failing, etc., or any other desired percentage thereof. However in other approaches, the predetermined condition may be met in response to the redundant cells having remained activated for a predetermined amount of time, a certain distribution of failed redundant cells across the MRAM array being met, receiving a user input, the amount of time between cell failures reaching a predetermined amount, etc. In other words, decision 512 may effectively be determining whether a sufficient amount of testing has been conducted on the redundant p-MTJ cells depending on the desired approach.

In response to determining that the predetermined condition has not yet been met, method 500 returns to operation 504 whereby additional monitoring of the remaining activated p-MTJ cells may be performed. It follows that operations 504, 508, 510 and/or decisions 506, 512 may be repeated in an iterative fashion, continuing to locate and deactivate failed ones of the p-MTJ cells in the redundant subset until the predetermined condition is finally met, whereby this iterative loop may be terminated. Accordingly, returning to decision 512, method 500 is illustrated as proceeding to operation 514 in response to determining that the predetermined condition has been met. There, operation 514 includes deactivating all remaining activated p-MTJ cells in the redundant subset. As described above, the predetermined condition may signify that a sufficient amount of testing has been conducted on the redundant p-MTJ cells. Thus, once the predetermined condition has been met, testing of the redundant subset of the p-MTJ cells in the MRAM array may be ended.

Information gathered while testing and monitoring performance of the redundant array may serve as a valuable indication as to how a remainder of the MRAM array will perform over time. As described above, because the redundant memory cells tested are located in the MRAM array itself, the redundant memory cells were likely fabricated using the same processes as the other memory cells in the MRAM array, and at about the same time also. Thus, the performance characteristics of the redundant memory cells tested using various ones of the approaches included herein provides an accurate indication as to the remainder of the MRAM array. Accordingly, referring still to FIG. 5A, operation 516 includes determining an effective lifespan of the remainder of the plurality of p-MTJ cells in the MRAM array which are not included in the redundant subset. The effective lifespan may be determined based at least in part on an amount of time which elapsed between activating the subset of p-MTJ cells in operation 502 and deactivating all remaining activated p-MTJ cells in the redundant subset. According to some approaches, this amount of time may correspond to an amount of time that spanned between performing operation 502 and a last of a predetermined number of the total number of p-MTJ cells in the redundant subset failing.

However, the effective lifespan of the non-redundant p-MTJ cells in the MRAM array may be determined according to any desired process. For instance, in different approaches the effective lifespan of the non-redundant p-MTJ cells in the MRAM array may be determined (e.g., calculated, extrapolated, predicted, etc.) using, equations, graphs, material characteristics, models, statistics, etc. or any other processes with would be apparent to one skilled in the art after reading the present description.

Although not shown in FIG. 5A, additional steps may be made depending on the effective lifespan determined in operation 516. For instance, if it is determined that the effective lifespan of the remainder of the memory cells in the MRAM array is lower than desired, additional testing of the MRAM array may be conducted to determine a cause of the shortened effective lifespan, whether one or more errors occurred during formation of the MRAM array, predict other MRAM arrays which may also have a low effective lifespan, etc. In other approaches, the MRAM array may be designated as being compromised and may be sold at a discounted rate, destroyed, used to conduct testing, etc.

Alternatively, if the effective lifespan is determined to be in a desirable range, the MRAM array may be cleared for sale, use, shipment to a user, etc. Moreover, because the testing of the MRAM array was conducted on redundant cells of memory included in the array to conduct the testing, the memory cells which are actually used by a user are desirably not effected at all from the testing. Furthermore, some of the approaches included herein are able to test multiple p-MTJ cells in potentially multiple columns across the MRAM array in parallel (e.g., simultaneously). Thus, quality, endurance, performance, etc. of memory may be tested in an efficient manner to determine an accurate lifespan of the components included in the memory array. If follows that the various approaches included herein are able to significantly overcome the shortcomings experienced by conventional testing processes.

Again, one of the reasons it is desirable to test the quality and/or endurance of memory cells is to determine whether the tunnel barrier layer of the MTJ sensor stack will last over time. Once the tunnel barrier layer fails, the whole cell is virtually useless as the sensor stack will no longer be able to store data. Moreover, the deterioration of the tunnel barrier layer for one cell of memory will also affect the ability to write to other cells in the same row and/or column.

Including redundant columns in the main memory array enables for exhaustive endurance testing to occur before the memory array is actually used. During the evaluation phase before use, the redundant cells may be automatically activated and exposed to various endurance cycles. Various ones of the approaches included herein are able to test numerous cells of a MRAM array in parallel by using a common gate driver. Moreover, the physical location of redundant cells which failed during testing may be efficiently and accurately determined by individually polling the status of the different memory cells. The results of this testing may further be utilized in order to successfully anticipate lifetime of layers in the memory cells themselves, with limited endurance cycle testing. Moreover, any one of the approaches herein may be further customized by formulating custom functions in terms of how to gauge endurance specifications of a certain memory product under qualification.

In view of the technology maturity involved in the market today, the various approaches included herein provide ways of effectively grading memory products in terms of different endurance cycles without degrading the fabricated product. By conducting localized monitoring across a large array of MRAM, any of the approaches included herein may be utilized to formulate useful anticipating function(s) which characterize endurance behavior of the fabricated components included in the memory and/or compensating functions based on the anticipating function(s), e.g., as would be appreciated by one skilled in the art after reading the present description.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems. One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product including a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A processor-implemented method for testing memory cell endurance, the processor-implemented method comprising:
   activating a subset of a plurality of perpendicular magnetic tunnel junction (p-MTJ) cells oriented in one or more columns of a MRAM array, wherein each of the p-MTJ cells includes a transistor and a magnetic tunnel junction (MTJ) sensor, wherein activating the subset of p-MTJ cells includes:
      applying a first voltage to a gate terminal of the transistor in each of the p-MTJ cells in the subset in parallel;
      applying a second voltage to a first end of the MTJ sensor in each of the p-MTJ cells in the subset in parallel, wherein a second end of the MTJ sensor in each of the p-MTJ cells is coupled to a source terminal of the transistor in the same p-MTJ cell; and
      applying a third voltage to a drain terminal of the transistor in each of the p-MTJ cells in the subset in parallel; and
   monitoring the activated subset of p-MTJ cells;
   determining whether any of the activated p-MTJ cells have failed; and
   in response to determining that an activated p-MTJ cell has failed, physically locating the failed p-MTJ cell.

2. The processor-implemented method as recited in claim 1, wherein physically locating the failed p-MTJ cell includes:
   deactivating all p-MTJ cells in the subset which are oriented in a same column as the failed p-MTJ cell; and
   reactivating a p-MTJ cell in the subset;
   performing an iterative process which includes:
      determining whether the reactivated p-MTJ cell is the failed p-MTJ cell;
      deactivating the reactivated p-MTJ cell in response to determining that the reactivated p-MTJ cell is not the failed p-MTJ cell; and
      reactivating a next p-MTJ cell in the subset; and
   terminating the iterative process in response to determining that the reactivated p-MTJ cell is the failed p-MTJ cell.

3. The processor-implemented method as recited in claim 2, comprising:
   reactivating all p-MTJ cells in the subset except for the failed p-MTJ cell;
   monitoring the activated subset of p-MTJ cells; and
   determining whether any of the activated p-MTJ cells have failed.

4. The processor-implemented method as recited in claim 2, wherein a common source line is coupled to the drain terminal of the transistor in each of the p-MTJ cells in the subset which are oriented in the same column as the failed p-MTJ cell.

5. The processor-implemented method as recited in claim 1, wherein a common source line is coupled to the drain terminal of the transistor in each of the p-MTJ cells in the subset which are oriented in a same one of the one or more columns.

6. The processor-implemented method as recited in claim 1, wherein a remainder of the plurality of p-MTJ cells in the MRAM array which are not included in the subset have not been written to.

7. The processor-implemented method as recited in claim 1, wherein the one or more columns which the subset of p-MTJ cells are oriented in are redundant columns, wherein one of the redundant columns is positioned at a first end of the MRAM array, wherein a second of the redundant columns is positioned at a second end of the MRAM array, the second end being opposite of the first end.

8. The processor-implemented method as recited in claim 1, wherein the one or more columns which the subset of p-MTJ cells are oriented in are redundant columns, wherein every $N^{th}$ column of the MRAM array is one of the redundant columns.

9. The processor-implemented method as recited in claim 1, comprising:
   deactivating the failed p-MTJ cell;
   performing an iterative process which includes:
      determining whether an additional one of the remaining activated p-MTJ cells has failed;
      in response to determining that an additional one of the remaining activated p-MTJ cells has failed, physically locating the additional failed p-MTJ cell; and
      deactivating the located additional failed p-MTJ cell; and
   deactivating all remaining activated p-MTJ cells in the subset in response to a predetermined number of a total number of p-MTJ cells in the subset failing.

10. The processor-implemented method as recited in claim 9, wherein all remaining activated p-MTJ cells in the subset are deactivated in response to all p-MTJ cells in the subset failing.

11. The processor-implemented method as recited in claim 9, comprising:
    determining an effective lifespan of a remainder of the plurality of p-MTJ cells in the MRAM array which are not included in the subset, the effective lifespan being based at least in part on an amount of time which elapsed between activating the subset of p-MTJ cells and the predetermined number of the total number of p-MTJ cells in the subset failing.

12. A computer program product comprising a non-transitory computer readable storage medium, the computer readable storage medium having program code stored thereon, the program code executable by a processor to cause the processor to perform a process comprising:
    activate, by the processor, a subset of a plurality of perpendicular magnetic tunnel junction (p-MTJ) cells oriented in one or more columns of a MRAM array, wherein each of the p-MTJ cells includes a transistor and a magnetic tunnel junction (MTJ) sensor, wherein activating the subset of p-MTJ cells includes:
       apply, by the processor, a first voltage to a gate terminal of the transistor in each of the p-MTJ cells in the subset in parallel;
       apply, by the processor, a second voltage to a first end of the MTJ sensor in each of the p-MTJ cells in the subset in parallel, wherein a second end of the MTJ sensor in each of the p-MTJ cells is coupled to a source terminal of the transistor in the same p-MTJ cell; and apply, by the processor, a third voltage to a drain terminal of the transistor in each of the p-MTJ cells in the subset in parallel; and monitor, by the processor, the activated subset of p-MTJ cells;

determine, by the processor, whether any of the activated p-MTJ cells have failed; and in response to determining that an activated p-MTJ cell has failed, physically locate, by the processor, the failed p-MTJ cell.

13. The computer program product as recited in claim 12, wherein physically locating the failed p-MTJ cell includes:

deactivating all p-MTJ cells in the subset which are oriented in a same column as the failed p-MTJ cell; and reactivating a p-MTJ cell in the subset;

performing an iterative process which includes:
determining whether the reactivated p-MTJ cell is the failed p-MTJ cell;
deactivating the reactivated p-MTJ cell in response to determining that the reactivated p-MTJ cell is not the failed p-MTJ cell; and
reactivating a next p-MTJ cell in the subset; and
terminating the iterative process in response to determining that the reactivated p-MTJ cell is the failed p-MTJ cell.

14. The computer program product as recited in claim 13, the program code executable by the processor to cause the processor to perform the process comprising:

reactivate, by the processor, all p-MTJ cells in the subset except for the failed p-MTJ cell;

monitor, by the processor, the activated subset of p-MTJ cells; and determine, by the processor, whether any of the activated p-MTJ cells have failed, wherein a common source line is coupled to the drain terminal of the transistor in each of the p-MTJ cells in the subset which are oriented in the same column as the failed p-MTJ cell.

15. The computer program product as recited in claim 12, wherein a common source line is coupled to the drain terminal of the transistor in each of the p-MTJ cells in the subset which are oriented in a same one of the one or more columns.

16. The computer program product as recited in claim 12, wherein a remainder of the plurality of p-MTJ cells in the MRAM array which are not included in the subset have not been written to.

17. The computer program product as recited in claim 12, wherein the one or more columns which the subset of p-MTJ cells are oriented in are redundant columns, wherein one of the redundant columns is positioned at a first end of the MRAM array, wherein a second of the redundant columns is positioned at a second end of the MRAM array, the second end being opposite of the first end.

18. The computer program product as recited in claim 17, wherein every $N^{th}$ column of the MRAM array between the first and second redundant columns is a redundant column.

19. The computer program product as recited in claim 12, the program code executable by the processor to cause the processor to perform the process comprising:

deactivate, by the processor, the failed p-MTJ cell;

perform, by the processor, an iterative process which includes:
determining whether an additional one of the remaining activated p-MTJ cells has failed;
in response to determining that an additional one of the remaining activated p-MTJ cells has failed, physically locating the additional failed p-MTJ cell; and
deactivating the located additional failed p-MTJ cell;

deactivate, by the processor, all remaining activated p-MTJ cells in the subset in response to a predetermined number of a total number of p-MTJ cells in the subset failing; and determine, by the processor, an effective lifespan of a remainder of the plurality of p-MTJ cells in the MRAM array which are not included in the subset, the effective lifespan being based at least in part on an amount of time which elapsed between activating the subset of p-MTJ cells and the predetermined number of the total number of p-MTJ cells in the subset failing.

20. The computer program product as recited in claim 19, wherein all remaining activated p-MTJ cells in the subset are deactivated in response to all p-MTJ cells in the subset failing.

* * * * *